United States Patent
Mushano et al.

(10) Patent No.: US 7,372,377 B2
(45) Date of Patent: May 13, 2008

(54) METHOD AND APPARATUS FOR POSITION IDENTIFICATION IN RUNLENGTH COMPRESSION DATA

(75) Inventors: Mitsuru Mushano, Kanagawa-ken (JP); Tomohide Hiragami, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 125 days.

(21) Appl. No.: 11/238,009

(22) Filed: Sep. 29, 2005

(65) Prior Publication Data

US 2006/0067586 A1 Mar. 30, 2006

(30) Foreign Application Priority Data

Sep. 29, 2004 (JP) .............................. 2004/284558

(51) Int. Cl.
*H03M 7/00* (2006.01)

(52) U.S. Cl. .......................................... 341/59; 341/60

(58) Field of Classification Search .................. 341/59, 341/60, 65, 67
See application file for complete search history.

(56) References Cited

U.S. PATENT DOCUMENTS

| | | | | |
|---|---|---|---|---|
| 5,329,313 A | * | 7/1994 | Keith ..................... | 375/240.22 |
| 5,701,125 A | * | 12/1997 | Berlin ......................... | 341/63 |
| 5,991,515 A | * | 11/1999 | Fall et al. ................... | 358/1.15 |
| 6,128,413 A | * | 10/2000 | Benamara .................... | 382/251 |
| 6,373,412 B1 | * | 4/2002 | Mitchell et al. .............. | 341/65 |
| 6,433,707 B1 | * | 8/2002 | Crandall ...................... | 341/50 |
| 6,985,903 B2 | * | 1/2006 | Biacs ......................... | 707/100 |
| 2004/0042675 A1 | * | 3/2004 | Kobayashi .................. | 382/245 |
| 2004/0113820 A1 | * | 6/2004 | Leanza ........................ | 341/50 |
| 2005/0089233 A1 | * | 4/2005 | Malvar ....................... | 382/238 |
| 2006/0074958 A1 | * | 4/2006 | Biacs ......................... | 707/101 |
| 2007/0008191 A1 | * | 1/2007 | Archbold et al. ............. | 341/50 |

FOREIGN PATENT DOCUMENTS

JP 2001-102937 A 4/2001

* cited by examiner

*Primary Examiner*—Linh V. Nguyen
(74) *Attorney, Agent, or Firm*—Sughrue Mion, PLLC

(57) ABSTRACT

A position in runlength compression data corresponding to a desired position in original data can be found fast. Index correspondence information is generated for representing correspondence between indexes representing predetermined positions in data arrangement of the original data having a plurality of values and positions corresponding thereto in the runlength compression data. The index closest to the desired position in the original data and an offset of the desired position from the index are found. Based on the index correspondence information, the corresponding index in the runlength compression data is found. The position corresponding to the desired position is then found in the runlength compression data, based on the corresponding index and the offset.

23 Claims, 8 Drawing Sheets

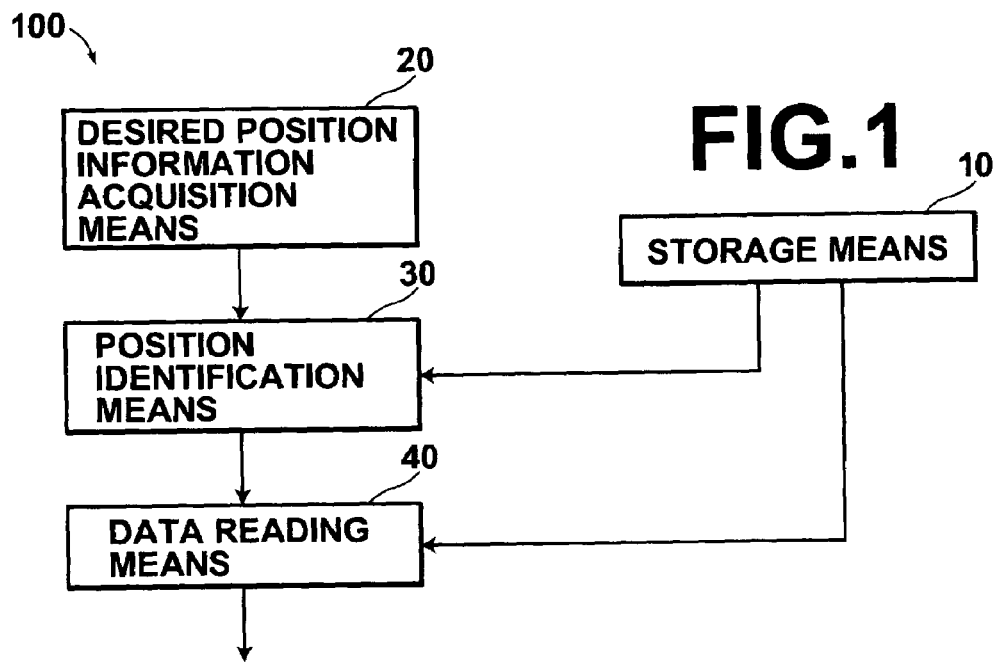
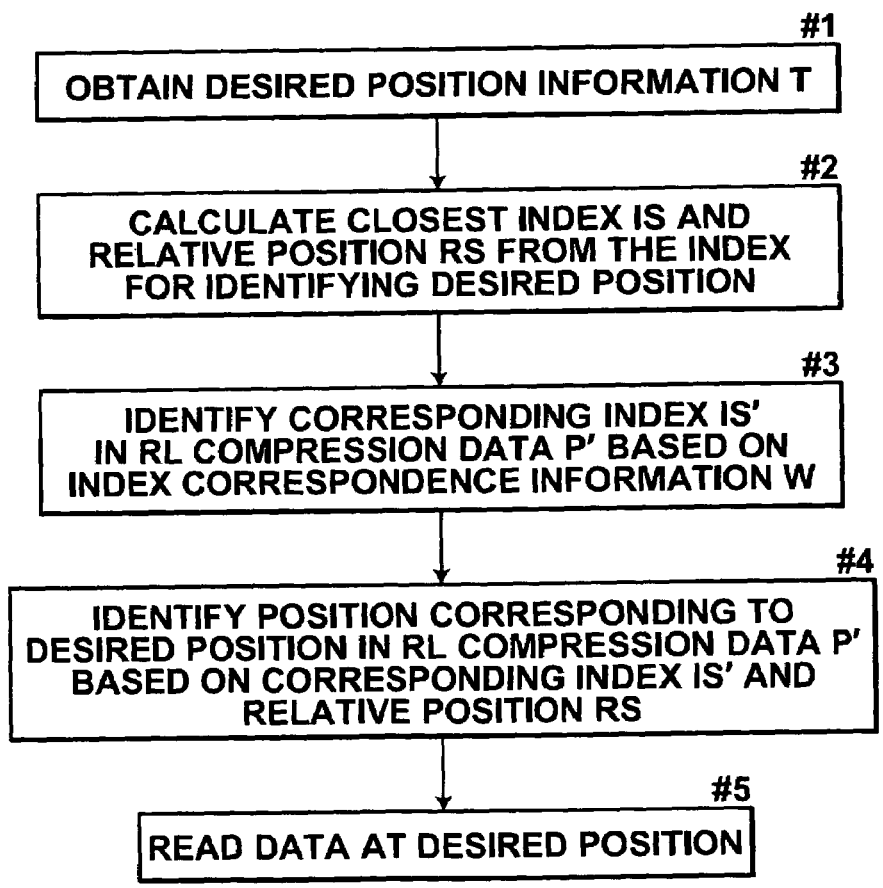

|           | 0  | 1 | 2 | 3 | 4 | 5 | 6 | 7 | 8 | 9 |
|-----------|----|---|---|---|---|---|---|---|---|---|
| rle_d1[]  | 20 |   |   |   |   |   |   |   |   |   |
| rle_d2[]  | 20 |   |   |   |   |   |   |   |   |   |
| rle_d3[]  | 7  | 2 | 4 | 1 | 6 |   |   |   |   |   |
| rle_d4[]  | 6  | 1 | 2 | 1 | 3 | 1 | 6 |   |   |   |
| rle_d5[]  | 6  | 1 | 3 | 1 | 2 | 1 | 6 |   |   |   |
| rle_d6[]  | 6  | 1 | 4 | 1 | 1 | 1 | 6 |   |   |   |
| rle_d7[]  | 7  | 1 | 4 | 2 | 6 |   |   |   |   |   |
| rle_d8[]  | 20 |   |   |   |   |   |   |   |   |   |

|             | 0     | 1     | 2      | 3      |
|-------------|-------|-------|--------|--------|
| index_d1[]  | (0,0) | (0,5) | (0,10) | (0,15) |
| index_d2[]  | (0,0) | (0,5) | (0,10) | (0,15) |
| index_d3[]  | (0,0) | (0,5) | (2,1)  | (4,1)  |
| index_d4[]  | (0,0) | (0,5) | (4,0)  | (6,1)  |
| index_d5[]  | (0,0) | (0,5) | (3,0)  | (6,1)  |
| index_d6[]  | (0,0) | (0,5) | (2,3)  | (6,1)  |
| index_d7[]  | (0,0) | (0,5) | (2,2)  | (4,1)  |
| index_d8[]  | (0,0) | (0,5) | (0,10) | (0,15) |

|        | 0 | 1 | 2 | 3 | 4 | 5 | 6 | 7 | 8 | 9 |
|--------|---|---|---|---|---|---|---|---|---|---|
| rle_d1[] | 5 | 5 | 5 | 5 |   |   |   |   |   |   |
| rle_d2[] | 5 | 5 | 5 | 5 |   |   |   |   |   |   |
| rle_d3[] | 5 | 2 | 2 | 1 | 3 | 1 | 1 | 5 |   |   |
| rle_d4[] | 5 | 1 | 1 | 2 | 1 | 3 | 1 | 1 | 5 |   |
| rle_d5[] | 5 | 1 | 1 | 3 | 1 | 2 | 1 | 1 | 5 |   |
| rle_d6[] | 5 | 1 | 1 | 3 | 1 | 1 | 1 | 1 | 1 | 5 |
| rle_d7[] | 5 | 2 | 1 | 2 | 2 | 2 | 1 | 5 |   |   |
| rle_d8[] | 5 | 5 | 5 | 5 |   |   |   |   |   |   |

FIG.6

|           | 0 | 1 | 2 | 3 |
|-----------|---|---|---|---|
| index_d1[] | 0 | 1 | 2 | 3 |
| index_d2[] | 0 | 1 | 2 | 3 |
| index_d3[] | 0 | 1 | 4 | 7 |
| index_d4[] | 0 | 1 | 5 | 8 |
| index_d5[] | 0 | 1 | 4 | 8 |
| index_d6[] | 0 | 1 | 4 | 9 |
| index_d7[] | 0 | 1 | 4 | 7 |
| index_d8[] | 0 | 1 | 2 | 3 |

FIG.7

| | 0 | 1 | 2 | 3 |
|---|---|---|---|---|
| index_d1[] | (0,0,20) | (0,5,15) | (0,10,10) | (0,15,5) |
| index_d2[] | (0,0,20) | (0,5,15) | (0,10,10) | (0,15,5) |
| index_d3[] | (0,0,7) | (0,5,2) | (2,1,3) | (4,1,5) |
| index_d4[] | (0,0,6) | (0,5,1) | (4,0,3) | (6,1,5) |
| index_d5[] | (0,0,6) | (0,5,1) | (3,0,1) | (6,1,5) |
| index_d6[] | (0,0,6) | (0,5,1) | (4,3,1) | (6,1,5) |
| index_d7[] | (0,0,7) | (0,5,2) | (2,2,2) | (4,1,5) |
| index_d8[] | (0,0,20) | (0,5,15) | (0,10,10) | (0,15,5) |

METHOD AND APPARATUS FOR POSITION IDENTIFICATION IN RUNLENGTH COMPRESSION DATA

BACKGROUND OF THE INVENTION

1. Field of the Invention

The present invention relates to a method and an apparatus for identifying a position in runlength compression data.

2. Description of the Related Art

Following improvements in processing performance by computers, data of large size are frequently being dealt with. When such large data are dealt with as they are, the amount of data processing increases, and a large memory space is occupied. Therefore, such data processing is inefficient and not economical. For this reason, data compression has been carried out to decrease a data size while losing as little information as possible.

Various data compression methods have been proposed. As one of such methods, a runlength compression method has been used. In runlength compression, redundancy of data of the same value appearing serially is used for coding the length of the serial data, and runlength compression data comprise length data representing the length. For example, a binary image comprising only black and white pixels can be represented by lengths of serial white pixels and lengths of serial black pixels (see Japanese Unexamined Patent Publication No. 2001-102937, for example).

In data processing, a value at a desired position in original data is sometimes read or processed. In this case, the desired position in the original data needs to be specified. In the original data before compression, an address is generally related to each value, and specification of the desired position is comparatively easy based on the address. However, in runlength compression data, an address is not related to each value. Therefore, in order to specify a position in the runlength compression data corresponding to the desired position in the original data, the order (the $N^{th}$ position, in this case) of the position from the first value is found in the original data. Lengths of values (that is, the number of values) included in length data comprising the runlength compression data are then added up from the beginning of the runlength compression data, and compared with N to judge whether or not a result of the addition is larger than N. In this manner, the desired position can be found in the runlength compression data.

However, serial addition of lengths of values included in length data from the beginning may need a large amount of operations.

SUMMARY OF THE INVENTION

A first method of the present invention for position identification in compression data comprises the steps of:

generating index correspondence information, representing correspondence between indexes representing predetermined positions in data arrangement of original data comprising a plurality of values and positions corresponding thereto in compression data, generated by carrying out runlength compression on at least a part of the original data; and identifying a position in the compression data corresponding to a desired position in the data arrangement of the original data, based on the index correspondence information.

A second method of the present invention for position identification in compression data comprises the steps of:

generating index correspondence data arrangement of information, representing correspondence between indexes representing predetermined positions in data arrangement of original data comprising a plurality of values and positions corresponding thereto in compression data, generated by carrying out runlength compression on at least a part of the original data;

finding one of the indexes near a desired position in the data arrangement of the original data and an offset of the desired position from the index, in order to specify the desired position; and finding the position in the compression data corresponding to the index according to the index correspondence information and identifying a position in the compression data corresponding to the desired position according to the position that has been found and according to the offset.

In the second method of the present invention for position identification in compression data, the index correspondence information may include:

length data identification information for identifying a part of length data including the position specified by each of the indexes in the compression data including the length data; and relative index position identification information for relatively identifying the position corresponding to the index in positions corresponding to the values included in the part of the length data identified by the length data identification information.

In the second method of the present invention for position identification in compression data, the position represented by each of the indexes in the compression data may agree with a position corresponding to either the first value or the last value in the values included in any one of parts of the length data comprising the compression data. The index correspondence information in this case includes the length data identification information for identifying the part of the length data including the position represented by the corresponding index.

In the second method of the present invention for position identification in compression data, the index near the desired position may be the index closest to the desired position.

In the first method and the second method of the present invention for position identification in compression data, the original data may be binary data.

Furthermore, in the first method and the second method of the present invention for position identification in compression data, the indexes may be defined at regular intervals in the data arrangement.

In the first method and the second method of the present invention for position identification in compression data, the step of identifying the position may be the step of identifying cutting positions in the compression data corresponding to two different desired positions in the data arrangement of the original data. In this case, data between the cutting positions are cut out thereafter from the compression data.

At this time, at least a part of the compression data may be cut out in the state of being compressed, as the data to be cut from the compression data.

In the first method and the second method of the present invention for position identification in compression data, the original data comprising the values may be image data comprising pixel values corresponding to pixels arranged in the form of a matrix comprising an image, and the compression data may be obtained by carrying out the runlength compression on the pixel values for each of pixel rows in the image. In this case, the desired position may be positions in the compression data corresponding to cutting positions for pixel groups along a line that is not parallel to the pixel rows in the image, in the case where length data groups corresponding to the pixel groups are obtained by connecting parts of the length data corresponding to the pixel groups cut in the pixel rows neighboring each other in the image.

An apparatus of the present invention for position identification in compression data comprises:

storage means for storing index correspondence information representing correspondence between indexes, representing predetermined positions in data arrangement of original data comprising a plurality of values and positions corresponding thereto in compression data, obtained by carrying out runlength compression on at least a part of the original data;

desired position information acquisition means for obtaining desired position information that specifies a desired position in the data arrangement of the original data and represents one of the indexes near the desired position and an offset of the desired position from the index; and position identification means for finding the position in the compression data corresponding to the index according to the index correspondence information and for identifying a position in the compression data corresponding to the desired position according to the position that has been found and according to the offset.

In the apparatus of the present invention for position identification in compression data, the index correspondence information may include:

length data identification information for identifying a part of length data including the position specified by each of the indexes in the compression data including the length data; and relative index position identification information for relatively identifying the position corresponding to the index in positions corresponding to the values included in the part of the length data identified by the length data identification information.

In the apparatus of the present invention for position identification in compression data, the position represented by each of the indexes in the compression data may agree with a position corresponding to either the first value or the last value in the values included in any one of parts of the length data comprising the compression data. The index correspondence information in this case includes the length data identification information for identifying the part of the length data including the position represented by the corresponding index.

In the apparatus of the present invention for position identification in compression data, the index near the desired position may be the index closest to the desired position.

In the apparatus of the present invention for position identification in compression data, the original data may be binary data.

In the apparatus of the present invention for position identification in compression data, the indexes may be defined at regular intervals in the data arrangement.

In the apparatus of the present invention for position identification in compression data, the position identification means may identify cutting positions in the compression data corresponding to two different desired positions in the data arrangement of the original data, and the position identification means may comprise means for cutting data between the cutting positions from the compression data.

In this case, the means for cutting the data may cut at least a part of the compression data in the state of being compressed, as the data to be cut from the compression data.

In the apparatus of the present invention for position identification in compression data, the original data comprising the values may be image data comprising pixel values corresponding to pixels arranged in the form of a matrix comprising an image, and the compression data may be obtained by carrying out the runlength compression on the pixel values for each of pixel rows in the image. In this case, the desired position may be positions in the compression data corresponding to cutting positions for pixel groups along a line that is not parallel to the pixel rows in the image, in the case where length data groups corresponding to the pixel groups are obtained by connecting parts of the length data corresponding to the pixel groups cut in the pixel rows neighboring each other in the image.

A data structure of the present invention for compression data includes:

compression data obtained by carrying out runlength compression on at least a part of original data comprising a plurality of values arranged in a form; and index correspondence information, representing correspondence between indexes defined discretely either in the original data or in the compression data and positions corresponding thereto in the other data.

A computer-readable recording medium of the present invention stores:

compression data obtained by carrying out runlength compression on at least a part of original data comprising a plurality of values arranged in a form; and index correspondence information representing correspondence between indexes defined discretely either in the original data or in the compression data and positions corresponding thereto in the other data.

A first data processing apparatus of the present invention comprises:

an electro-magnetically readable recording medium storing compression data, obtained by carrying out runlength compression on at least a part of original data comprising a plurality of values arranged in a form, and index correspondence information representing correspondence between indexes defined discretely either in the original data or in the compression data and positions corresponding thereto in the other data; and means for identifying a position in the compression data corresponding to a specific position in the original data, based on the index correspondence information read from the recording medium.

A second data processing apparatus of the present invention comprises:

an electro-magnetically readable recording medium storing compression data, obtained by carrying out runlength compression on at least a part of original data comprising a plurality of values arranged in a form, and index correspondence information representing correspondence between indexes defined discretely either in the original data or in the compression data and positions corresponding thereto in the other data; and means for reading the compression data and the index correspondence information from the recording medium and for cutting data in a range in the compression data corresponding to a specific range in the original data according to the index correspondence information.

In the second data processing apparatus of the present invention, the means for cutting the data may cut at least a part of the compression data in the state of being compressed.

A third method of the present invention for position identification in compression data comprises the step of identifying a position in compression data corresponding to a specific position in original data, based on index correspondence information. The compression data are obtained by carrying out runlength compression on at least a part of the original data comprising a plurality of values arranged in a form, and the index correspondence information represents correspondence between indexes defined discretely either in the original data or in the compression data and positions corresponding thereto in the other data.

A data cutting method of the present invention comprises the steps of:

specifying a cutting range in compression data corresponding to a specific range in original data, based on index correspondence information representing correspondence between indexes defined discretely either in the original data comprising a plurality of values arranged in a form or in the compression data obtained by carrying out runlength compression on at least a part of the original data and positions corresponding thereto in the other data; and cutting data in the cutting range from the compression data.

In the data cutting method of the present invention, the step of cutting the data in the cutting range may be the step of cutting at least a part of the compression data in the state of being compressed, as the data to be cut from the compression data.

An index correspondence information generation method of the present invention comprises the step of:

defining indexes discretely either in original data comprising a plurality of values arranged in a form or in compression data obtained by carrying out runlength compression on at least a part of the original data; and generating index correspondence information representing correspondence between the indexes and positions corresponding thereto in the other data.

An index correspondence information generation apparatus of the present invention comprises:

means for discretely defining indexes either in original data comprising a plurality of values arranged in a form or in compression data obtained by carrying out runlength compression on at least a part of the original data; and means for generating index correspondence information representing correspondence between the indexes and positions corresponding thereto in the other data.

In this case, the index correspondence information generation apparatus of the present invention may further comprise means for generating the compression data by carrying out the runlength compression on at least the part of the original data.

An image drawing apparatus of the present invention comprises:

an electro-magnetically readable recording medium storing compression data obtained by carrying out runlength compression on at least a part of original data comprising a plurality of values arranged in a form, and index correspondence information representing correspondence between indexes defined discretely either in the original data or in the compression data and positions corresponding thereto in the other data;

means for reading the compression data and the index correspondence information from the recording medium and for cutting data in a cutting range in the compression data corresponding to a specific range in the original data according to the index correspondence information; and image drawing means for drawing a image based on the data in the cutting range.

An image drawing method of the present invention comprises the steps of:

specifying a cutting range in compression data corresponding to a specific range in original data, based on index correspondence information representing correspondence between indexes defined discretely either in the original data comprising a plurality of values arranged in a form or in the compression data obtained by carrying out runlength compression on at least a part of the original data and positions corresponding thereto in the other data;

cutting data in the cutting range from the compression data; and drawing an image based on the data in the cutting range.

According to an aspect of the present invention, fast identification can be realized regarding the position in the compression data corresponding to the desired position in the original data.

BRIEF DESCRIPTION OF THE DRAWINGS

FIG. 1 shows the configuration of an image data reading apparatus 100;

FIG. 2 is a flow chart showing a procedure carried out by the image data reading apparatus 100;

FIG. 6 shows another example of the runlength compression data P';

FIG. 7 shows another example of the index correspondence information W;

DESCRIPTION OF THE PREFERRED EMBODIMENTS

Figures 3, 4, 5:
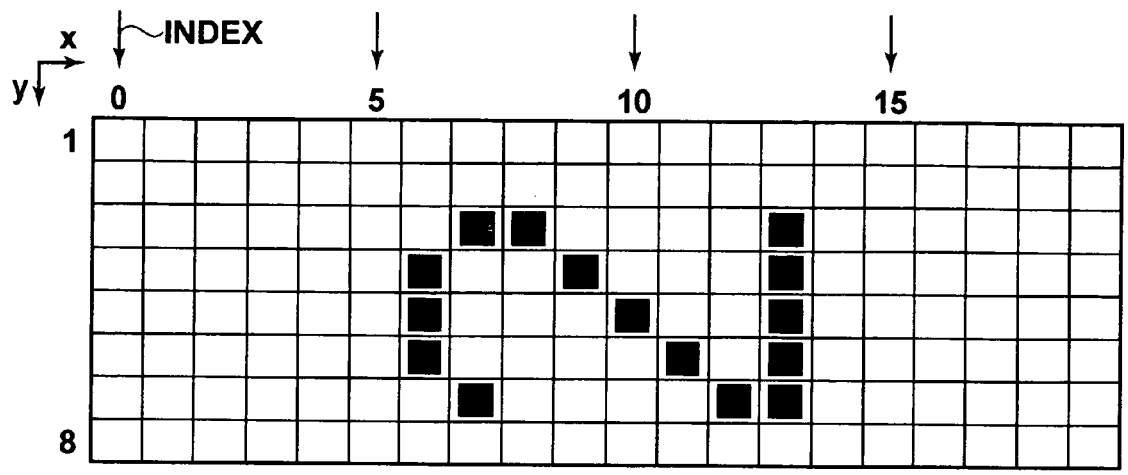
FIG. 3 shows an example of a digital image P.
FIG. 4 shows an example of runlength compression data P'.
FIG. 5 shows an example of index correspondence information W.

Hereinafter, embodiments of the present invention will be described.

FIG. 1 shows the configuration of an image data reading apparatus 100 of an embodiment of the present invention.

The image data reading apparatus 100 comprises storage means 10, desired position information acquisition means 20, position identification means 30, and data reading means 40. The storage means 10 stores runlength compression data P' obtained by runlength compression of original data P comprising a plurality of values arranged in the form of data array, and index correspondence information W representing correspondence between indexes representing predetermined positions in the data arrangement of the original data P and positions corresponding thereto in the runlength compression data P'. The desired position information acquisition means 20 obtains desired position information T that specifies a desired position in the original data. The desired position information T represents a corresponding one of the indexes near the desired position in the data arrangement of the original data P and an offset of the desired position from the index. The position identification means 30 finds the position in the runlength compression data P' corresponding to the index near the desired position in the original data P according to the index correspondence information W, and finds a position in the runlength compression data P' corresponding to the desired position according to the position that has been found and according to the offset. The data reading means 40 reads and outputs a value from the position corresponding to the desired position in the runlength compression data P'.

The original data P are image data representing a digital image P, and comprise binary data having the arrangement of data values $dy(x)$ (where $x=0,1,2,\ldots$ and $y=1,2,3,\ldots$) representing density (either black or white) at coordinates $(x,y)$ in the image P.

The runlength compression data P' obtained by runlength compression of the image data P comprise length data $rle\_dy[pointer]$ where $pointer=0, 1, 2$ and so on. The length data represent a length of a sequence of the same value in each of pixel rows (a horizontal line) y in the image P. The pointer is a parameter representing the order of appearance of the corresponding part of the length data in each of the pixel rows y. The length data in the runlength compression data may have color codes added thereto for representing colors in the image, which can be omitted.

The indexes as marks in the original data P are defined at regular intervals in the data arrangement of the original data P corresponding to each of the pixel rows in the image P. In this embodiment, the indexes include the first pixel in each of the pixel rows, and represent the positions defined at regular intervals H from the first pixel.

The index correspondence information W comprises position data $index\_dy[index\_pointer]$, where $index\_pointer=0, 1, 2$, and so on, which is a parameter representing the order of each of the indexes in each of the pixel rows y. The position data represent where each of the indexes in each of the pixel rows y in the image P is located in the runlength compression data P'. The position data $index\_dy[index\_pointer]$ are represented by a pointer $rle\_pointer$ (where $rle\_pointer=0, 1, 2$, and so on) and an offset $rle\_offset$ (where $rle\_offset=0, 1, 2$, and so on). The pointer $rle\_pointer$ as length data identification information identifies the part of the length data including the position represented by each of the indexes, in the runlength compression data. In other words, the pointer $rle\_pointer$ is a parameter representing the order of the part of the length data including the position represented by each of the indexes in each of the pixel rows y. The offset $rle\_offset$ as relative index position identification information identifies a relative position of the position represented by the index in values included in the corresponding part of the length data identified by the pointer (that is, in values appearing serially in the original data when the length data are decompressed). In other words, the offset $rle\_offset$ is a parameter representing the position of the index in the corresponding part of the length data identified by the pointer $rle\_pointer$.

The desired position information acquisition means 20 obtains, as the desired position information T, coordinates $(xs, ys)$ of a desired pixel in the image P. The desired position information acquisition means 20 also finds the preceding index closest to the desired position in the original data P (hereinafter referred to as an index IS) and an offset RS of the desired position from the index IS, in order to identify the position of the desired pixel having a value $dys(xs)$ in the original data P. The index IS is represented by a pixel row ys and a parameter $index\_pointer\_s$ (where $index\_pointer\_s=0, 1, 2$, and so on) representing the order of each of the indexes in the row. The offset RS is represented by a parameter $rlt\_s$ (where $rlt\_s=0, 1, 2$, and so on) representing the order from the index IS. The $index\_pointer\_s$ and $rlt\_s$ can be calculated by Equations (1) and (2) below:

$$index\_pointer\_s = INT(xs/H) \quad (1)$$

$$rlt\_s = xs - H \times index\_pointer\_s \quad (2)$$

where INT is a function for rounding down; and H is a predetermined pixel interval, along the data arrangement, that defines the index.

The position identification means 30 reads the index correspondence information W from the storage means 10, and finds a corresponding index IS' that corresponds to the index IS in the runlength compression data P', based on the index correspondence information W. The position identification means 30 identifies the position (IS'+RS) in the runlength compression data P' corresponding to the desired position by using the corresponding index IS' and the offset RS. Hereinafter, this procedure will be described specifically.

(1) Find the parameters that identify the corresponding index IS' from the parameters identifying the index IS The parameters ($rle\_pointer\_s$ and $rle\_offset\_s$) are found from the position data $index\_dys[index\_pointer\_s]$ in the index correspondence information W by using the pixel row ys and the $index\_pointer\_s$.

(2) Find the position corresponding to the desired position based on the corresponding index IS' and the offset RS (2-1) Set $n=0$; initial setting of a parameter n (2-2) Judge if $rlt\_s < \Sigma\ (i=0 \rightarrow n)\ rle\_dys[rle\_pointer\_s+i] - rle\_offset\_s$ \quad (3);

judge whether the position corresponding to the desired position is included in a part of the length data appearing $n^{th}$ from the part of the length data including the corresponding index IS'

(2-3) If a result of judgment at (2-2) is affirmative, the position corresponding to the desired position is located at a position offset by $(rle\_offset\_s+rlt\_s) - (\Sigma\ (i=0 \rightarrow n)\ rle\_dys[rle\_pointer\_s+i] - rle\_dys[rle\_pointer\_s+n])$ from the first position corresponding to $rle\_dys[rle\_pointer\_s+n]$. If the result at (2-2) is negative, the procedure at (2-2) is repeated.

The data reading means 40 reads the value at the position in the runlength compression data P' corresponding to the desired position found by the position identification means 30, from the runlength compression data P' stored in the storage means 10.

A procedure carried out by the image data reading apparatus 100 will be described next by using an example. FIG. 2 is a flow chart showing the procedure.

In this embodiment, the image P is a digital image comprising 8 pixels in the vertical direction and 20 pixels in the horizontal direction, as shown in FIG. 3. The coordinates in the image P are defined by an origin (0,1) in the upper left corner of the image P, a horizontal x axis in the direction shown by an arrow X, and a vertical y axis in the direction shown by an arrow Y. The original data P has either one of two values (such as 0 and 1) corresponding to the density at each of the pixels in the image P. The runlength compression data P' are obtained by carrying out runlength compression on the original data P for each of the pixel rows in the image P. FIG. 4 shows the runlength compression data P' obtained in this manner.

The indexes are defined at 5-pixel intervals (H) in each of the pixel rows in the image P including the pixel at the beginning thereof. FIG. 5 shows the index correspondence information W representing the correspondence between the positions represented by the indexes defined in this manner and the position data representing the corresponding positions in the runlength compression data P'.

The desired position information acquisition means 20 receives an input by an operator or from another apparatus, and obtains the coordinates (xs, ys) of the desired pixel in the image P as the desired position information T (#1). The desired position information acquisition means 20 then finds the closest preceding index IS and the offset RS from the index IS, for identifying the position in the image P corresponding to the coordinates (#2). Assume that the desired pixel is (13,3) in this example. According to Equations (1) and (2) described above, the parameters for finding the index IS and the offset RS are found from the intervals H=5 and the coordinates xs=13 and ys=3:

index_pointer_s=INT (xs/H)=INT(13/5)=2 rlt_s=xs−H×index_pointer_s=13−5×2=3

After the index IS and the offset RS have been found by the desired position information acquisition means 20 in the above manner, the position identification means 30 reads the index correspondence information W from the storage means 10. The position identification means 30 finds the parameters for identifying the corresponding index IS', based on the index correspondence information W (#3). Since the pixel row ys=3 and the parameter index_pointer_s=2, the position data are index_dys[index_pointer_s]=index_d3[2]=(2,1) Therefore, the parameters rle_pointer_s=2, and rle_offset_s=1.

The position corresponding to the desired position is then found from the corresponding index IS' and the offset RS (#4). Since rlt_s=3, rle_pointer_s=2, and rle_offset_s=1, a result of the procedure from (2-1) to (2-3) is as follows:

If n=0, rlt_s<Σ (i=0→n) rle_dys[rle_pointer_s+i]−rle_offset_s is equivalent to rlt_s<rle_d3[2]−rle_offset_s. In this case, the left hand side of the inequality is 3 while the right hand side is 4−1=3. Therefore, the result of the judgment is negative. Therefore, let n=n+1 and judge again.

If n=1, rlt_s<Σ (i=0+n) rle_dys[rle_pointer_s+i]−rle_offset_s is equivalent to rlt_s<rle_d3[2]+rle_d3[3]−rle_offset_s. In this case, the left hand side is 3 while the right hand side is 4+1−1=4. Therefore, the result of the judgment is affirmative. Consequently, the position corresponding to the desired position is found to be included in a part of the length data rle_d3[3]. Since rle_pointer_s=2, rle_offset_s=1, rlt_s=3, ys=3, and n=1, (rle_offset_s+rlt_s)−(Σ(i=0→n) rle_dys[rle_pointer_s+i]−rle_dys[rle_pointer_s+n]) = rle_offset_s+rlt_s)−(rle_d3[2]+rle_d3[3]−rle_d3[3]) =(1+3)−(4+1−1) =0

Therefore, the position corresponding to the desired position is located in the part of the length data rle=d3[3] (=rle_dys[rle_pointer_s+n]) with the offset being 0 from the first value.

After the position corresponding to the desired position has been found, the data reading means 40 reads the value at the position in the runlength compression data P' from the storage means 10, and outputs the value (#5).

As has been described above, according to the image data reading apparatus in the embodiment of the present invention, the index correspondence information W is generated in advance for representing the correspondence between the indexes at the predetermined positions in the original data P and the positions corresponding thereto in the runlength compression data P' obtained by runlength compression of the original data P. Based on the index correspondence information W, positions in the original data P are related to corresponding positions in the runlength compression data P' by the indexes and the relative positions to the index. In this manner, the position in the runlength compression data P' corresponding to the desired position in the original data P is identified. Therefore, without finding the order of each value in the runlength compression data by adding up the lengths represented by the length data, the position corresponding to the desired position can be understood as the relative position to the closest index. Therefore, fast identification can be carried out regarding the position in the runlength compression data P' corresponding to the desired position in the original data P.

In the embodiment described above, only the desired position is specified and the value at the corresponding position in the runlength compression data is read. However, a plurality of desired positions maybe specified so that all he values in a range specified by the corresponding positions in the runlength compression data may be read and output.

Furthermore, in the runlength compression data P', the position represented by each of the indexes may agree with a position of either the first value or the last value in the corresponding part of the length data in the runlength compression data. In this case, the index correspondence information W includes the pointer rle_pointer_s as the length data identification information that identifies the part of the length data including the position represented by each of the indexes. In other words, even in the case where the same values are arranged serially in the original data, the values are forcibly cut at the position represented by the corresponding index. In this manner, the position of each of the indexes always corresponds to either the first value or the last value in the corresponding part of the length data. Therefore, the positions of the indexes can be identified in the runlength compression data P' by using only the information on the pointer for identifying the corresponding part of the length data. For example, in the case where the original data P represent the image shown in FIG. 3 and the indexes are defined at the 5-pixel intervals, the runlength compression data and the index correspondence information W are as shown in FIGS. 6 and 7, respectively. In this manner, although a rate of compression is sacrificed, only the pointer rle_pointer_s is enough for specifying the position data comprising the index correspondence information W. In this case, in order to specify a position in the runlength compression data P', let rle_offset_s=0 in the embodiment described above.

As has been described above, merits and demerits are observed between the case where the length data in the runlength compression data are forcibly cut at the positions of the indexes and the case where the length data are not cut at the positions of the indexes. Therefore, in order to obtain a more desired effect, these two methods may be switched from one to the other as necessary.

In this embodiment, the size of the image P represented by the original data P is extremely small and the intervals between the indexes are also small for the sake of simpler description. However, the size of the image and the intervals of the indexes can be far larger in reality. The larger the data size becomes, the longer the time necessary for adding up the lengths in the length data becomes. Therefore, the present invention is more effective.

Especially, the present invention is more effective if this embodiment is applied to an image drawing apparatus dealing with a large amount of data (such as various kinds of printers including ink jet printers, various kinds of digital exposure apparatuses of surface exposure method using spatial light modulators or the like, and various kinds of image drawing apparatuses of laser scanning method).

In the embodiment described above, the original data P are the image data. However, the method of the present invention for identifying a position in runlength compression data can be applied to data other than image data. Moreover, after a position has been identified, the value at the position may subjected to various kinds of processing such as modification, insertion of another value, and deletion, in addition to reading.

When the data are cut between two positions identified in the runlength compression data corresponding to two positions in the original data, the data can be cut in the state of being compressed by appropriately changing the values of the corresponding parts of the length data at the cutting positions.

Hereinafter, an embodiment will be described wherein the runlength compression data position identification method described above is applied to a method of obtaining drawing spot data in an exposure apparatus.

An exposure apparatus has been proposed for carrying out exposure by modulating light beams with use of spatial light modulators such as a digital micromirror device (DMD) according to image data. In such an exposure apparatus, frame data comprising data for a plurality of drawing spots corresponding to micromirrors are input to memory cells of a DMD while the DMD is being moved relatively to an exposure surface in a predetermined scanning direction, for example. In this manner, the drawing spots corresponding to the micromirrors of the DMD are formed sequentially, and a desired image is generated on the exposure surface.

In the case where a wiring pattern is drawn on a substrate by exposing the substrate with use of such an exposure apparatus for example, the substrate may have been distorted due to heating processing carried out thereon in advance or a direction of movement of the substrate may deviate because of accuracy of a mechanism to convey the substrate. In such a case may be desired drawing the wiring pattern with the same distortion as the substrate or cancellation of deviation in the wiring pattern caused by the deviation in the direction of substrate movement.

For this reason, there has been proposed a drawing spot data acquisition method for obtaining drawing spot data used for drawing an image on a substrate while sequentially generating drawing spots on the substrate with relative movement to the substrate of an area in which the drawing spots are generated (hereinafter referred to as the drawing spot generating area) according to the drawing spot data (see Japanese Patent Application No. 2005-103787). In this method, information on a path of the drawing spot generating area in the substrate or in an image space in the substrate (hereinafter referred to as the drawing path information) is obtained at the time of image drawing, and information is obtained on a drawing spot path in the drawing spot generating area in image data representing the image, based on the drawing path information. Data of the drawing spots corresponding to the drawing spot path are then obtained from the image data, according to the drawing spot path information.

In the embodiment described below, the runlength compression data position identification method described above is applied to the drawing spot data acquisition method.

The drawing path information described above can be obtained from detected position information representing positions of alignment marks, by detecting the alignment marks set on the substrate before distortion with use of a camera or the like. Alternatively, the drawing path information may be obtained based on deviation information representing deviation in an actual relative movement direction of the substrate at the time of image drawing from a predetermined relative movement direction thereof.

In the embodiment below, the case will be described where an image such as a wiring pattern is drawn on a substrate by an exposure apparatus having a DMD, with the same distortion as the substrate.

Figure 8:
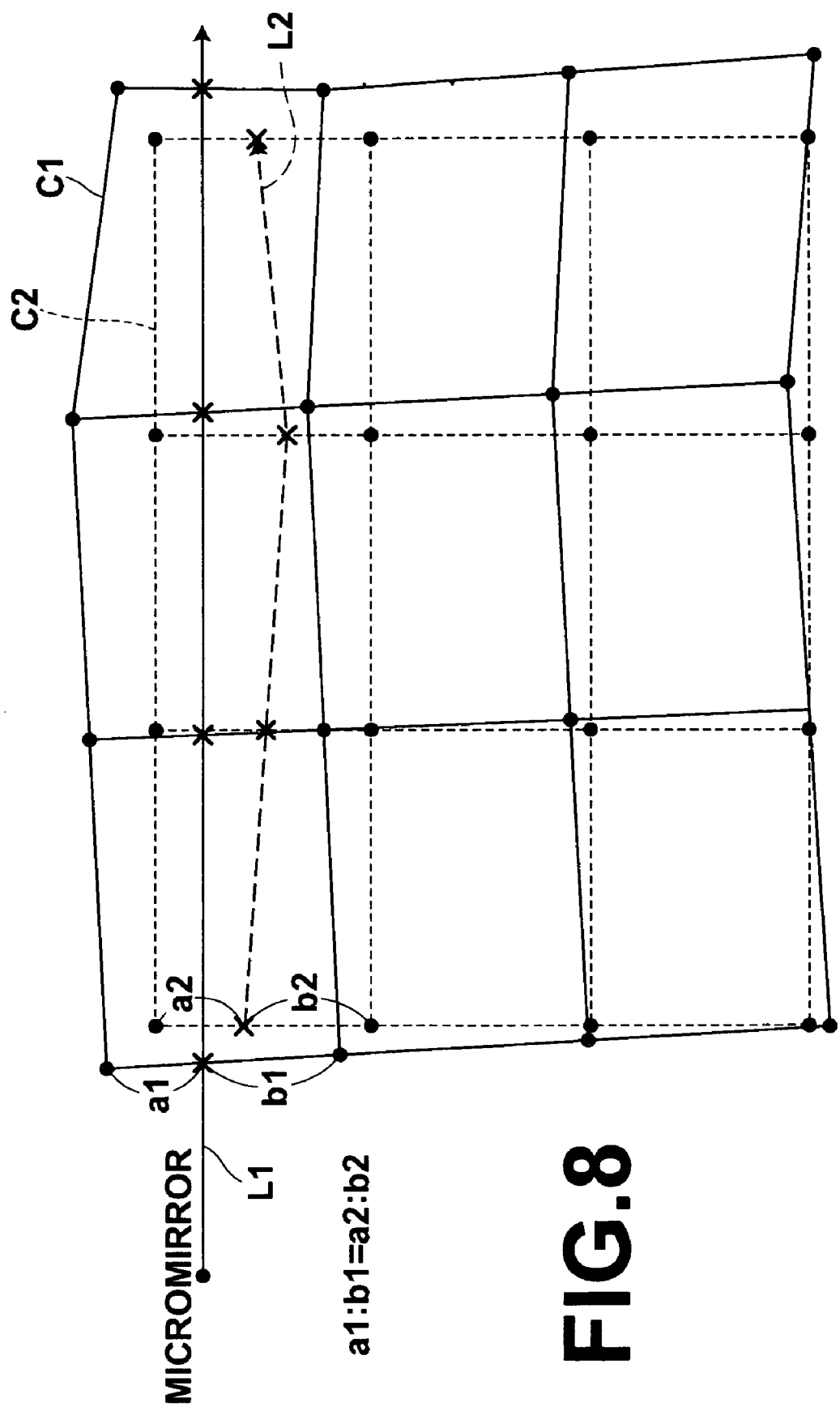
FIG. 8 shows relationships between detected position information, drawing path information, and drawing spot path information.

FIG. 8 shows relationships between lines C1, C2, L1, and L2. The lines C1 (the detected position information) are grid lines connecting grid points obtained by using a camera or the like, through detection of positions of a plurality of alignment marks preset at predetermined intervals in a horizontal direction and in a vertical direction on the substrate. The lines C2 are grid lines connecting the grid points at positions where the alignment marks are supposed to be located (the positions before distortion). The line L1 is used as the drawing path information representing a path of one of micromirrors comprising the DMD. The line L2 is used as the drawing spot path information, and represents a line obtained by converting relative positions of the line L1 to the grid lines C1 into corresponding positions on the lines C2. In other words, the line L2 connects points dividing internally a line segment in one of the grid lines C2 into a ratio a2:b2 that is the same as a ratio a1:b1 of internal division of a line segment connecting two of the grid points predetermined on a corresponding one of the lines C1 by the line L1.

As shown in FIG. 8, in order to draw the image such as a wiring pattern in the same distortion as the substrate, the image needs to be generated on an exposure surface by sequentially generating drawing spot groups corresponding to the micromirror along the line L2 in a drawing spot generating area in image data representing the image.

More specifically, in the method of position identification in runlength compression data described above, the original data are the image data comprising pixel values corresponding to pixels arranged in the form of a matrix forming the image, and the runlength compression data are data obtained by carrying out runlength compression on the pixel values for each of pixel rows in the image. The desired position refers to positions in the runlength compression data corresponding to cutting positions for pixel groups along a line not parallel to the pixel rows in the image, in the case where length data groups corresponding to the pixel groups are obtained by connecting parts of the length data corresponding to the pixel groups cut in the pixel rows neighboring each other in the image.

Figures 9, 10:
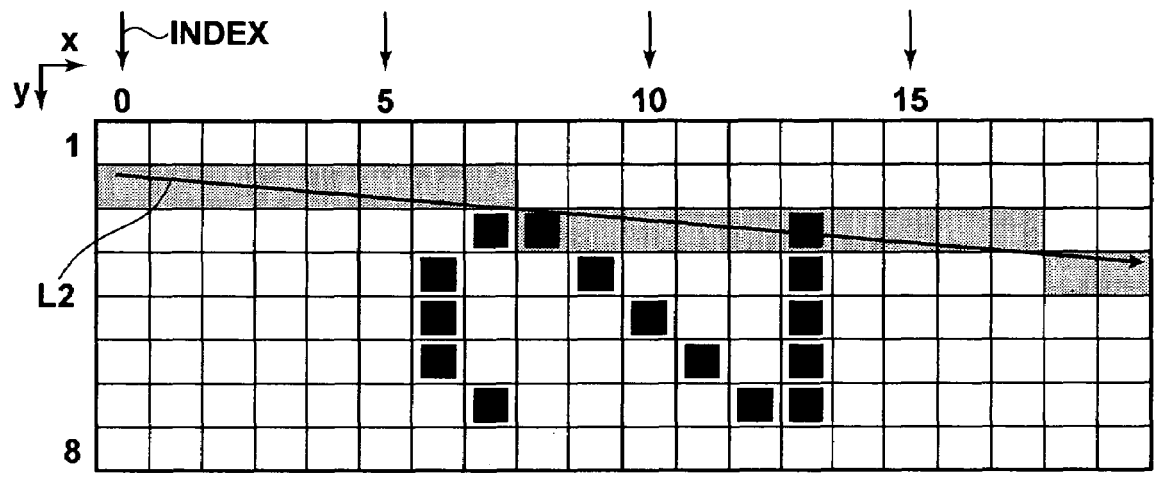
FIG. 9 shows how drawing spot groups are cut for each of a plurality of rows by a line L2 representing a drawing spot path.
FIG. 10 shows modified index correspondence information.

FIG. 9 shows the line L2 representing the drawing spot path in the drawing spot generating area in the image data, in the case where the image to be drawn is the image shown in FIG. 3. The image data are given as the runlength compression data shown in FIG. 4.

In order to obtain the drawing spot groups corresponding to the micromirror for exposure at desired positions on the substrate, the drawing spot groups at positions passed by the line L2 in the drawing spot generating area in the image data need to be cut for each of the pixel rows, and the drawing spot groups are connected in the order of cutting. For this purpose, the cutting positions for the respective pixel rows need to be specified. In the case where the number of the drawing spots represented by the length data are added up from the first spot in each of the pixel rows in order to specify the cutting positions, identification of the cutting positions becomes time-consuming. For this reason, the indexes are set at regular intervals (every 5 pixels in this case), and the cutting positions are searched for and identified near the indexes according to the method described above.

FIG. 10 shows the index correspondence information prepared in this manner. In order to be useful at the time of connection of the runlength compression data that have been cut, the index correspondence information includes information for each of the indexes, on the number of the drawing spots including and following the drawing spot corresponding to the index included in the corresponding part of the length data, in addition to the information on the position of the index. More specifically, z1 refers to the order of the part of the length data including the index (starting from 0) from the beginning of the corresponding one of the pixel rows, z2 refers to the order (starting from 0) of the drawing spot corresponding to the index from the first drawing spot in the part of the length data, and z3 refers to the number of the drawing spots (the number of the pixels) including and following the drawing spot corresponding to the index in the corresponding part of the length data (hereinafter referred to as the number of the remaining drawing spots). Therefore, the index correspondence information is represented as (z1, z2, z3).

In the case where the substrate has been distorted as shown by the grid lines C1 in FIG. 8, the length of the line L1 representing the path of the corresponding micromirror (that is, an actual drawing path) is found to be longer than the length of the line L2 representing the drawing spot path on an ideal substrate without distortion, in the respective line segments corresponding to each other. Therefore, the length of the drawing spot groups may need to be increased in some cases. For example, if the length of the line L1 (the length in the actual substrate) is longer than the length of the line L2 (the length in the ideal substrate) by 1 pixel, a value for the additional pixel needs to be added to the drawing spot data. In this case, the same value as the value at a position that is immediately before or after the position (such as the center) where the value needs to be added is added as the value for the additional pixel. Consequently, after the cutting positions have been specified, the number of the pixels in the drawing spot data is adjusted upon necessity for each of the line segments in the line L2. For this purpose, each of the line segments corresponding to the drawing spot groups is divided equally according to the number of pixels that need to be added (or deleted), and the position of division is found from the indexes. The value of the part of the length data at the position is then increased (or decreased).

In this manner, the drawing spot data representing the drawing spot groups corresponding to the micromirror are obtained in the form of runlength compression data. More specifically, the drawing spot data are obtained in the following manner.

As shown in FIG. 9, the data in the line segments cut by the line L2 are d2(0~7)+d3(8~17)+d4(18~19). The position d2(0) is the first pixel among 20 pixels represented by the value 20 in rle_d2[0], as found from the index correspondence information (0,0,20) in index_d2[0] in FIG. 10. The position d2(7) is the eighth pixel among the 20 pixels represented by the value 20 in rle_d2[0], as found from the index correspondence information (0,5,15) in index_d2[1]. Therefore, these two points are found to be in the same data section, and the first value to be output as the runlength compression data is [8] (0~7).

For the position d3(8), the number of the remaining pixels represented by the index correspondence information (0,5,2) in index_d3[1] (that is, 2) is not larger than the number of the drawing spots from the corresponding index to the following data cutting position (that is, 8−5=3). Therefore, rle_d3[1] is referred to, and the value (that is, 2) is added to the number of the remaining pixels (that is, 2). Consequently, 2+2=4, which is larger than the number of the drawing spots to the following cutting position (that is, 3). In this manner, the next cutting position is found to be the second pixel in rle_d3[1]. Likewise, the position d3(17) is found to be the forth pixel among 6 pixels represented by the value 6 in rle_d3[4], and [1,4,1,4] is output as the following runlength compression data.

For the points d4 (18~19), the two end points are included in (6,1,5) in index_d4[3], and the number of the remaining pixels (that is, 5) is larger than the number of the drawing spots therein. Therefore, [2] (18~19) is output as the following runlength compression data.

Consequently, the drawing spot data are represented as [8,1,4,1,4,2] by connecting all the data that have been output. The part [4,2] maybe represented collectively as [6], since all of these data represent white pixels.

In the case where the number of the drawing spots needs to be adjusted in the drawing spot data, an appropriate one of the values in the corresponding part of the length data is increased or decreased for cancellation of shortage or redundancy of the number of the drawing spots, as has been described above.

In the case where the drawing spot data corresponding to the micromirrors are obtained by cutting the data for each of the line segments corresponding to the drawing spot groups at the positions along the line representing the drawing spot path in the drawing spot generating area in the image data represented as the runlength compression data and by connecting the data for exposure by the exposure apparatus having the DMD at a desired position on the substrate, if the method described above for position identification in runlength compression data is applied for identifying the cutting positions for the data, the cutting positions can be found fast and the drawing spot data can thus be obtained promptly. In this manner, fast exposure can be realized.

Figure 11:
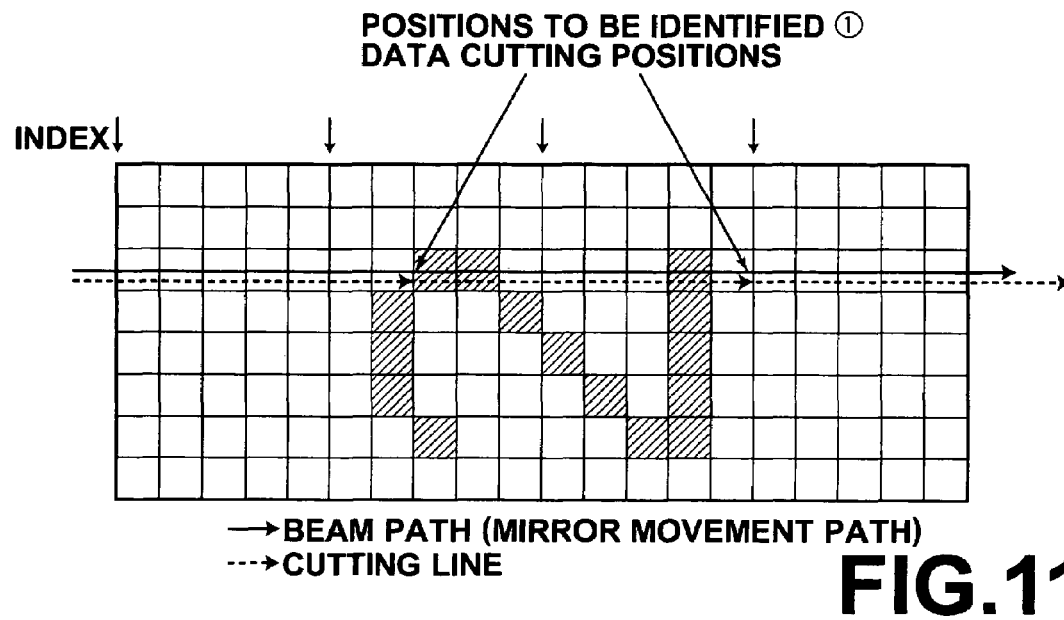
FIG. 11 shows how cutting positions are identified for copying data in a range.
Figure 12:
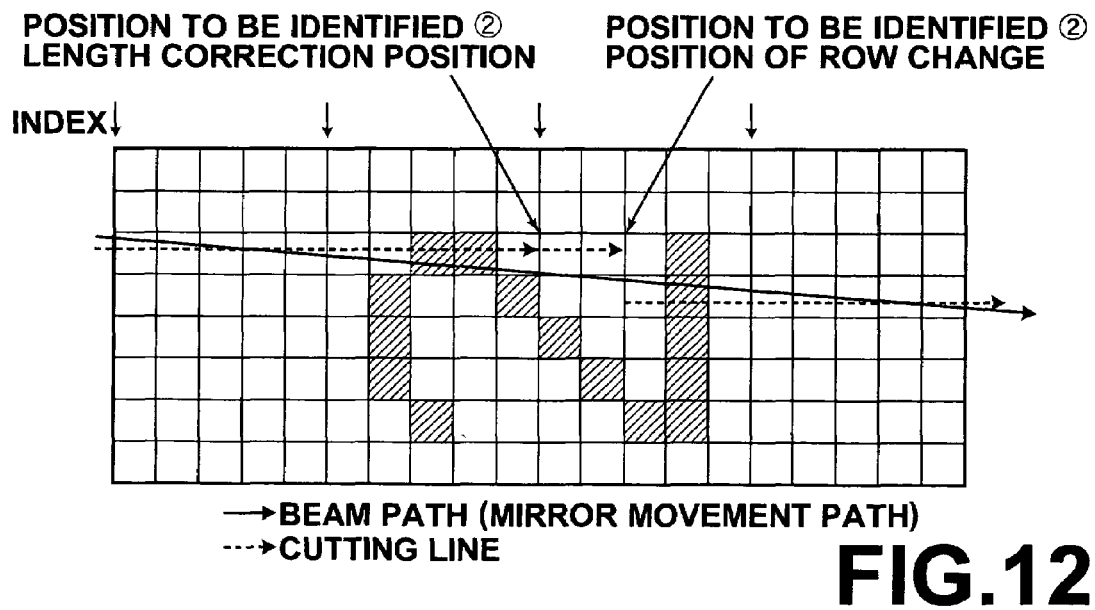
FIG. 12 shows how positions to correct data length are found.

The method of the present invention for position identification in runlength compression data can be applied to other cases. For example, as shown in FIG. 11, this method can be applied to the case where cutting positions are identified for copying image data in a range, by using the same exposure apparatus. Furthermore, in the case where a length of drawing spot data is different from a length of corresponding image data due to a beam path being not parallel to a line for data cutting as shown in FIG. 12, this method can be applied to identification of cutting positions by using the same exposure apparatus, for correcting the length of the image data to be cut in one line segment as a part of the drawing spot data.

In addition, this method may be applied for identifying a position at which the number of drawing spots is adjusted upon acquisition of drawing spot data from image data according to a length of a drawing path on an actual substrate having been distorted. Moreover, this method may also be applied for identifying row change positions in the case where drawing spot data are obtained for a plurality of rows in image data.

In this example, the runlength compression data are divided regardless of the positions of the indexes. However, the runlength compression data may be divided forcibly at the positions of the indexes. In this case, the drawing spot data can be found in the same manner as has been described above.

Figure 13:
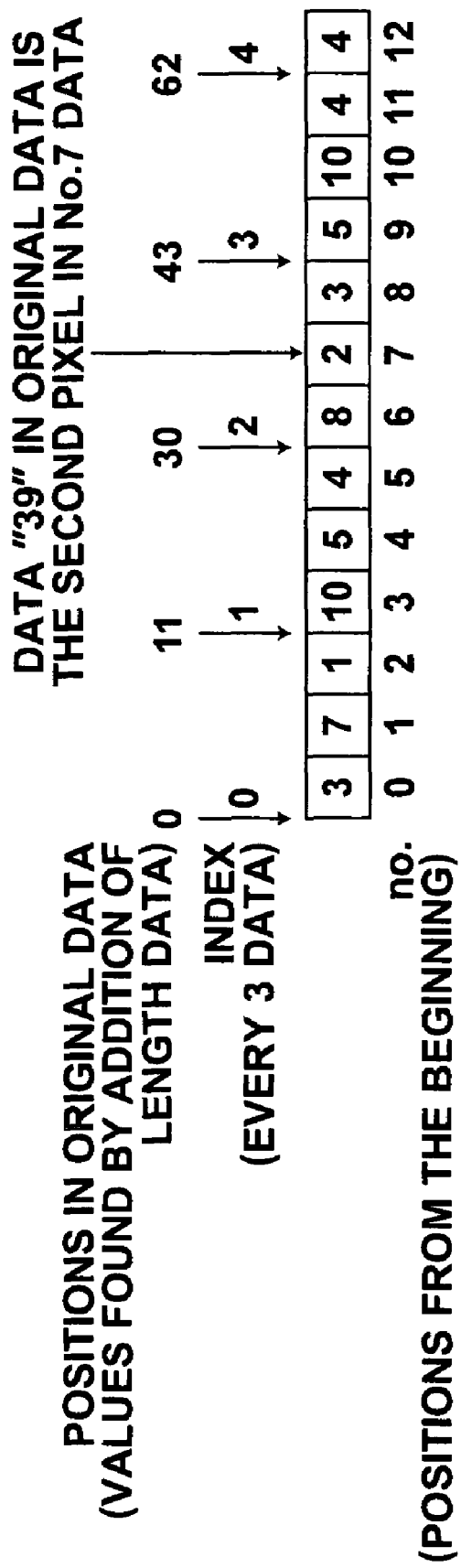
FIG. 13 shows the case where indexes are set in runlength compression data.

Furthermore, the indexes may be set not only in the original data but also in the runlength compression data. For example, as shown in FIG. 13, indexes may be set in parts of length data appearing in order at predetermined intervals in the length data comprising runlength compression data. In this case, index correspondence information includes information on the order of each of the indexes in the corresponding part of the length data and on the position corresponding to the index in original data. In this case, a position in the runlength compression data corresponding to a desired position in the original data is identified in the following manner. For example, in the case shown in FIG. 13, if the position corresponding to the position "39" in the original data (that is, the position of the $40^{th}$ value) is to be found in the runlength compression data, the value represented by each of the indexes for showing the position in the original data is sequentially compared with the value 39, from the first index. As a result, the position "39" is found to be located between index (2) and index (3), since 30<39<40. The values of the following length data are sequentially added to the position "30" in the original data represented by index(2), and compared with 39. As a result, the position "39" is found to be the second pixel in the value "2" in the part of length data represented by No. 7, since (30+8)<39<(30+8+2).

As a manner of representation of length data comprising runlength compression data may be used a method of adding to the first bit a color bit representing whether the following part of the length data represent white or black in the case where the length data are 8-bit data. Alternatively, another method may be used for inserting "0" to a part of length data when the length data representing either black or white changes to the other color, since the length data generally represent black and white in alternation. In any method, difference between black and white represented by the length data at a cutting position can be understood with certainty, and drawing spot data can be obtained appropriately as has been described above.

A compression method such as PackBits or SRLE (Switched RunLength Encoding), whereby at least a part of original data are runlength compressed, may also be adopted in this embodiment. In this case, a group of discontinuous data may be used as a part of length data to which an index is added.

Figure 14:
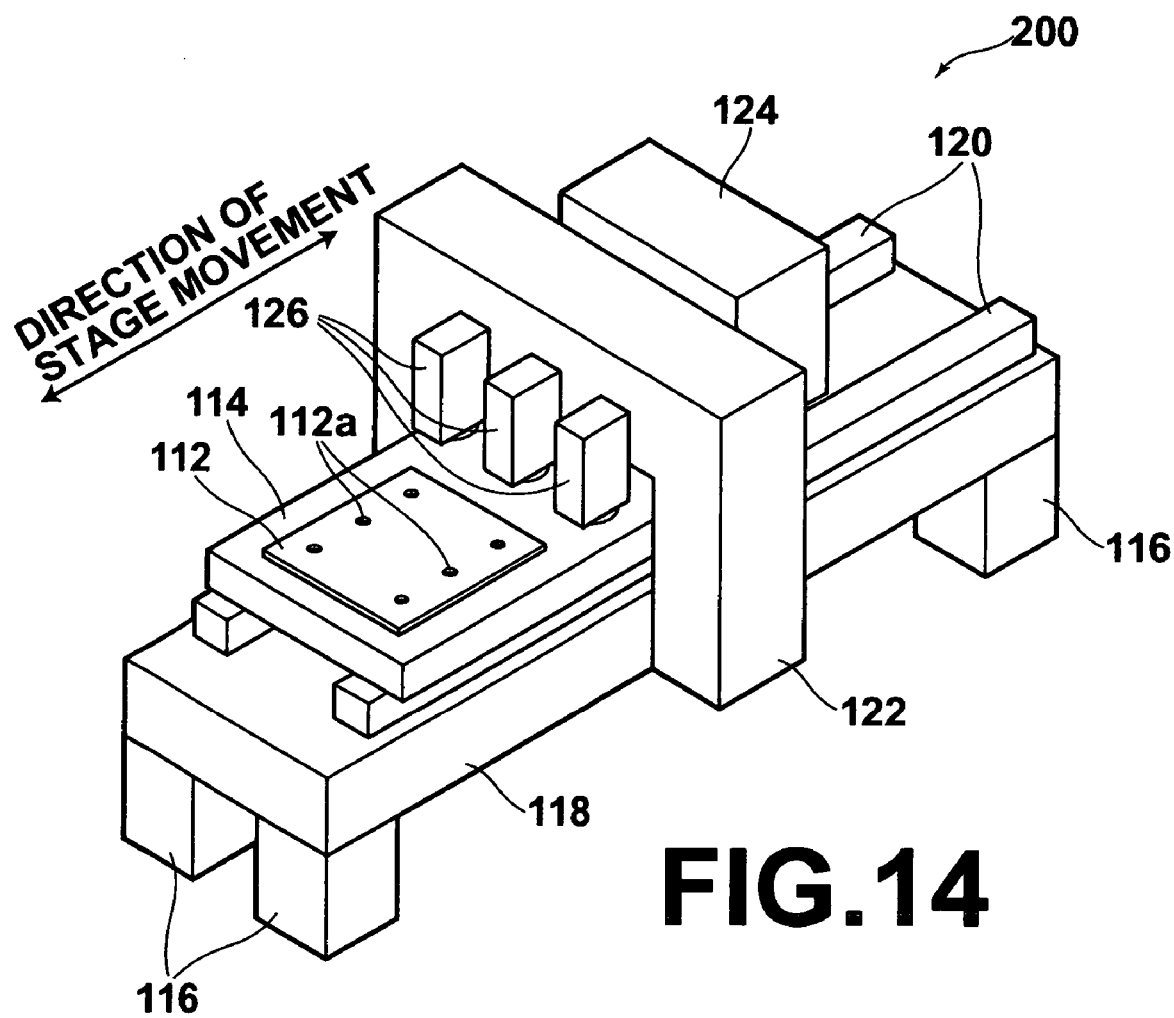
FIG. 14 shows an example of an exposure apparatus to which the present invention is applied.

FIG. 14 shows an example of an exposure apparatus to which the present invention is applied. As shown in FIG. 14, an exposure apparatus 200 comprises a planar stage 114 for holding a substrate 112 by suction. On the upper surface of a thick plate-like mount 118 supported by four legs 116 are placed two guide rails 120 elongated along the direction of movement of the stage 114. The stage 114 is placed in such a manner that the direction of longer sides thereof is parallel to the direction of movement thereof. The stage 114 is supported by the guide rails 120 so that the stage 14 can move back and forth along the guide rails.

A U-shaped gate 122 is situated at the center of the mount 118 so as to straddle the path of the stage 114. Both ends of the U-shaped gate 122 are fixed to side faces of the mount 118. A scanner 124 is located beside the U-shaped gate 122 while a plurality of cameras 126 are placed opposite to the scanner 124 across the gate 122. The sensors 26 detect positions of a plurality of alignment marks 112a set in a circular shape on the substrate 112 and at front and rear ends of the substrate 112.

The scanner 124 and the cameras 126 are attached to the gate 122 at fixed positions around the start of forward movement of the stage 114. The scanner 124 and the sensors 126 are connected to a controller (not shown) thereof.

The exposure apparatus 200 aligns the substrate 112 by detecting the alignment marks 112a with use of the cameras 126. Thereafter, the exposure apparatus 200 draws an image on the substrate 112 by using the scanner 124. The scanner 124 has a plurality of exposure heads, and each of the exposure heads has a DMD used as spatial light modulators.

What is claimed is:

1. A data processing method comprising the steps of:
preparing index correspondence information including positions in compression data corresponding to a plurality of indexes set in original data, the compression data obtained by carrying out runlength compression on at least a part of the original data; and
identifying a position in the compression data corresponding to a desired position in the original data, based on the index correspondence information,
wherein the step of identifying the position in the compression data includes the steps of:
finding a specific one of the indexes near the desired position in the original data;
finding a specific position in the compression data corresponding to the specific index according to the index correspondence information;
finding an offset of the desired position in the original data from the specific index; and
identifying the position in the compression data corresponding to the desired position in the original data according to the specific position in the compression data and the offset.

2. The data processing method according to claim 1, wherein the step of preparing the index correspondence information includes the step of generating the index correspondence information.

3. The data processing method according to claim 1, wherein the index correspondence information includes:
information on parts of length data corresponding to the respective indexes in the length data included in the compression data; and
information on the positions corresponding to the respective indexes in the parts of the length data corresponding to the indexes.

4. The data processing method according to claim 1, wherein,
among length data included in the compression data, either the first value or the last value in each of parts of the length data corresponding to the indexes corresponds to one of the indexes, and
the index correspondence information includes information on the parts of the length data corresponding to the respective indexes.

5. The data processing method according to claim 1, wherein the indexes are set at predetermined intervals in the original data.

6. A data processing method comprising the steps of:
preparing index correspondence information including positions in compression data corresponding to a plurality of indexes set in original data, the compression data obtained by carrying out runlength compression on at least a part of the original data; and
identifying a position in the compression data corresponding to a desired position in the original data, based on the index correspondence information;
wherein the step of preparing the index correspondence information includes the step of generating the index correspondence information; and
wherein the specific index near the desired position in the original data is the index closest to the desired position in the original data.

7. A data processing method comprising the steps of:
preparing index correspondence information including positions in compression data corresponding to a plurality of indexes set in original data, the compression data obtained by carrying out runlength compression on at least a part of the original data; and
identifying a position in the compression data corresponding to a desired position in the original data, based on the index correspondence information;
wherein the step of identifying the position in the compression data comprises the step of identifying cutting positions corresponding to two different desired positions in the original data, and
the data processing method further comprises the step of cutting data between the cutting positions from the compression data.

8. The data processing method according to claim 7, wherein the step of cutting the data includes cutting the compression data without decompressing at least a part of the compression data.

9. A data processing method comprising the steps of:
preparing index correspondence information including positions in compression data corresponding to a plurality of indexes set in original data, the compression data obtained by carrying out runlength compression on at least a part of the original data; and
identifying a position in the compression data corresponding to a desired position in the original data, based on the index correspondence information;
the original data being image data comprising pixel values corresponding to pixels arranged in a matrix comprising an image,
the compression data being obtained by carrying out the runlength compression on the pixel values for each of pixel rows in the image, and
the desired position being positions in the compression data corresponding to cutting positions for pixel groups along a line that is not parallel to the pixel rows in the image, in the case where length data groups corresponding to the pixel groups are obtained by connecting parts of length data corresponding to the pixel groups cut in the pixel rows neighboring each other in the image.

10. A data processor comprising:
storage means for storing index correspondence information including positions in compression data corresponding to a plurality of indexes set in original data, the compression data obtained by carrying out runlength compression on at least a part of the original data; and
position identification means for identifying a position in the compression data corresponding to a desired position in the original data, based on the index correspondence information;
wherein the position identification means includes:
means for finding a specific one of the indexes near the desired position in the original data;
means for finding a specific position in the compression data corresponding to the specific index, according to the index correspondence information;
means for finding an offset of the desired position in the original data from the specific index; and
means for identifying the position in the compression data corresponding to the desired position in the original data, according to the specific position in the compression data and the offset.

11. The data processor according to claim 10, wherein the index correspondence information includes:
information on parts of length data corresponding to the respective indexes, in the length data included in the compression data; and
information on the positions corresponding to the respective indexes in the parts of the length data corresponding to the indexes.

12. The data processor according to claim 10, wherein,
among length data included in the compression data, either the first value or the last value in each of parts of the length data corresponding to the indexes corresponds to one of the indexes, and
the index correspondence information includes information on the parts of the length data corresponding to the respective indexes.

13. The data processor according to claim 12, wherein the indexes are set at predetermined intervals in the original data.

14. The data processor according to claim 10, wherein the specific index near the desired position in the original data is the index closest to the desired position in the original data.

15. The data processor according to claim 10, wherein the original data are binary data.

16. The data processor according to claim 10, wherein the indexes are set at predetermined intervals in the original data.

17. A data processor comprising:
storage means for storing index correspondence information including positions in compression data corresponding to a plurality of indexes set in original data, the compression data obtained by carrying out runlength compression on at least a part of the original data; and
position identification means for identifying a position in the compression data corresponding to a desired position in the original data, based on the index correspondence information;
wherein
the position identification means comprises means for identifying cutting positions corresponding to two different desired positions in the original data, and
the data processor further comprises means for cutting data between the cutting positions from the compression data.

18. The data processor according to claim 17, wherein the means for cutting the data cuts the compression data without decompressing at least a part of the compression data.

19. A data processor comprising:

storage means for storing index correspondence information including positions in compression data corresponding to a plurality of indexes set in original data, the compression data obtained by carrying out runlength compression on at least a part of the original data; and position identification means for identifying a position in the compression data corresponding to a desired position in the original data, based on the index correspondence information;

the original data being image data comprising pixel values corresponding to pixels arranged in a matrix comprising an image, the compression data being obtained by carrying out the runlength compression on the pixel values for each of pixel rows in the image, and the desired position being positions in the compression data corresponding to cutting positions for pixel groups along a line that is not parallel to the pixel rows in the image, in the case where length data groups corresponding to the pixel groups are obtained by connecting parts of length data corresponding to the pixel groups cut in the pixel rows neighboring each other in the image.

20. An image drawing apparatus comprising:

a recording medium storing compression data obtained by carrying out runlength compression on at least a part of original data, and information on positions either in the original data or in the compression data corresponding to indexes defined discretely in the other data;

means for cutting data in a cutting range in the compression data corresponding to a specific range in the original data, based on the information on the positions stored in the recording medium; and means for drawing an image based on the data in the cutting range cut.

21. The image drawing apparatus according to claim 20, wherein the means for cutting the data in the cutting range cuts the compression data without decompressing at least a part of the compression data; and the means for drawing the image has means for decompressing the data in the cutting range cut.

22. An image drawing method comprising the steps of:

identifying a cutting range in compression data corresponding to a specific range in original data, based on information on positions either in the original data or in the compression data corresponding to indexes defined discretely in the other data, the compression data obtained by carrying out runlength compression on at least a part of original data;

cutting data in the cutting range from the compression data; and drawing an image based on the data in the cutting range cut.

23. The image drawing method according to claim 22, wherein the step of cutting the data in the cutting range is the step of cutting the compression data without decompressing at least a part of the compression data; and the step of drawing the image includes the step of decompressing the data in the cutting range cut.

* * * * *